United States Patent [19]

Brown et al.

[11] 4,101,924
[45] Jul. 18, 1978

[54] SEMICONDUCTOR RADIATION DETECTOR

[75] Inventors: Dale M. Brown; Marvin Garfinkel, both of Schenectady, N.Y.

[73] Assignee: General Electric Company, Schenectady, N.Y.

[21] Appl. No.: 807,080

[22] Filed: Jun. 16, 1977

[51] Int. Cl.² .................... H01L 27/14; G01T 1/22
[52] U.S. Cl. .................................. 357/30; 250/370
[58] Field of Search ............... 250/370, 371; 357/14, 357/29, 30

[56] References Cited

U.S. PATENT DOCUMENTS 3,418,473   12/1968   Blue .................................. 250/370

Primary Examiner—Alfred E. Smith
Assistant Examiner—Janice A. Howell
Attorney, Agent, or Firm—Julius J. Zaskalicky; Joseph T. Cohen; Marvin Snyder

[57] ABSTRACT

A structure is described in which a large area depletion region is provided in a semiconductor substrate of one conductivity type for the conversion of photons into charge and in which a small area region of opposite conductivity type is provided in the substrate for read out of the collected charge.

7 Claims, 3 Drawing Figures

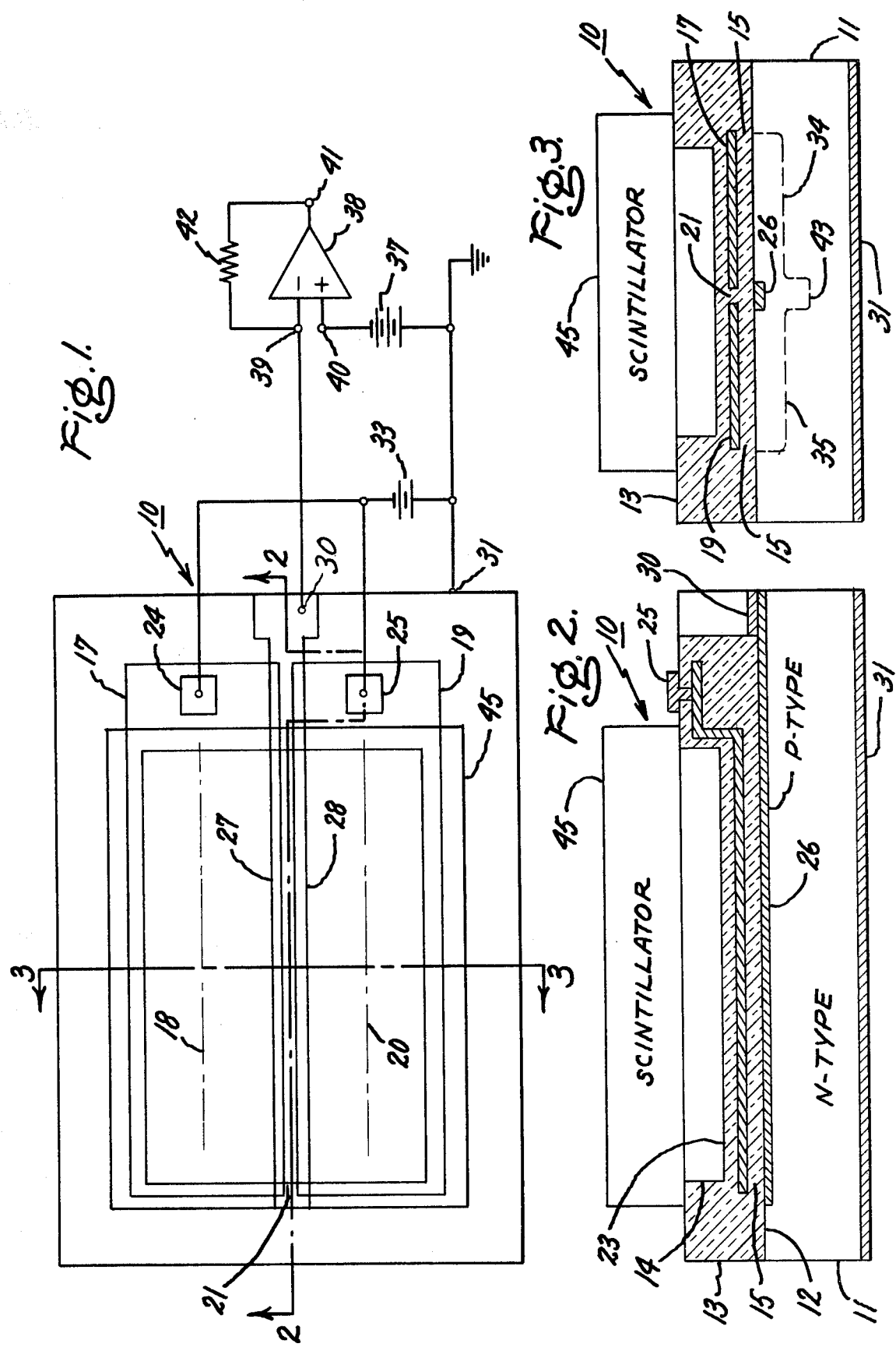

SEMICONDUCTOR RADIATION DETECTOR

The present invention relates in general to radiation detecting devices and in particular to such devices for converting radiation in the form of X-rays and light into electrical signals.

An object of the present invention is to provide a detector of high collection efficiency.

Another object of the present invention is to provide a detector having high sensitivity to radiation yet providing low output capacitance for electrical signals.

In carrying out the invention in one illustrative embodiment thereof, there is provided a substrate of semiconductor material of one conductivity type. A first layer of a transparent insulating material is provided overlying a major surface of the semiconductor substrate. A second layer of a transparent conductive material overlies the first layer and forms a capacitor with the substrate and the first layer. A region of opposite conductivity type is provided in the substrate contiguous to the surface adjacent region of said substrate underlying said layer of transparent conductive material. The area of the second layer of transparent conductive material is substantially larger than the area of the region of opposite conductivity in the major surface of the substrate.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 is a plan view of a radiation sensing device in accordance with the present invention;

FIG. 2 is a sectional view of the device of FIG. 1 taken along section lines 2—2 showing the internal construction thereof;

FIG. 3 is another sectional view of the device of FIG. 1 taken along section lines 3—3 also showing the internal construction thereof.

Referring now to FIGS. 1, 2 and 3 there is shown a radiation sensing device 10 made in accordance with the present invention. The device 10 includes a substrate 11 of monocrystalline silicon semiconductor material of N-type conductivity and relatively high resistivity, for example, 3 ohm centimeters. A thick layer 13 of insulation, such as silicon dioxide, is formed on a major surface 12 of the substrate. The substrate 11 may conveniently be 10 mils thick and the layer of thick insulation may be 1 micron thick. An elongated rectangular recess 14 is formed in the thick insulating layer extending to within a short distance of the major surface of the semiconductor substrate 11 to provide a thin layer of insulation, for example, 0.1 microns thick, over the major surface. Overlying substantially one half of the recess 14 and also extending over an adjacent portion of the thick layer of insulation is transparent conductive member 17. The longitudinal axis 18 of the conductive member 17 is parallel to the long dimension of the recess 14. Overlying substantially the other half of the recess 14 and also extending over an adjacent portion of the thick insulation is another conductive member 19 having a longitudinal axis 20 parallel to the long dimension of the recess 14. Adjacent edges of the elongated conductive members 17 and 19 are spaced apart to form a narrow gap 21 having a longitudinal axis parallel to the long dimension of the recess 14. The conductive members 17 and 19 are constituted of a transparent conductive material such as antimony tin oxide, indium tin oxide, or tin oxide. The conductive members 17 and 19 may also be constituted of thin layers of metal, for example molybdenum approximately 10 Angstroms thick. A thin layer 23 of silicon dioxide is formed over the transparent electrodes 17 and 19 to provide protection for the electrodes. Terminals 24 and 25 provide electrical connection to the conductive members 17 and 19, respectively. Also provided in the semiconductor substrate is an elongated region 26 of P-type conductivity having a longitudinal axis parallel to the long dimension of the recess 14. The P-type region 26 underlies the gap 21 with one edge 27 underlying electrode 17 and the other longitudinal edge 28 underlying conductive member 19. Preferably, the edge 27 underlies the adjacent edge of transparent conductive member 17, and edge 28 underlies the adjacent edge of transparent conductive member 19 to keep capacitive coupling between the conductive members 17, 19 and P-type region 26 to a minimum. Terminal 30 provides conductive connection to the P-type region 26. Terminal 31 secured to the bottom surface of the substrate 11 provides conductive connection thereto.

FIG. 1 also shows a circuit for operating the device 10. The circuit includes a first bias source 33 having the positive terminal thereof connected to a ground and to the substrate terminal 31 and having the negative terminal thereof connected to terminals 24 and 25. The source 33 establishes depletion regions 34 and 35 in the substrate, as shown in FIG. 3, which collect minority carrier charge generated by radiation incident on the depletion regions 34 and 35. Bias potential for the P-type region 26 is provided by the bias source 37 and high gain differential amplifier 38. The differential amplifier 38 includes an inverting terminal 39, a noninverting terminal 40, and an output terminal 41. The positive terminal of the source 37 is connected to ground and the negative terminal thereof is connected to the noninverting terminal 40. The inverting terminal 39 is connected to the terminal 30 for the P-type region 26. A feedback resistance 42 is connected between the output terminal 41 and the noninverting terminal 39. The high gain differential amplifier 38 with resistive feedback functions to maintain the differential in voltage between the inverting terminal 39 and the noninverting terminal 40 close to zero. The negative potential of the source 37 appears on the P-type region 26 and establishes a depletion region 43 in the substrate, as shown in FIG. 3. The absolute value of the potential of source 37 is substantially greater than the absolute value of the voltage of source 33. Thus, the absolute value of the potential of the diffused region 26 is substantially greater than the absolute value of the surface potential of the substrate underlying the conductive members 17 and 18. Any minority charge collected in the depletion regions 34 and 35 as a result of incident radiation or from thermal excitation flows into the P-type region 26 and to the terminal 39. As terminals 39 and 40 are maintained at the same potential as a consequence of the action of the amplifier 38, the charge collected in the depletion regions 34 and 35 flows through the resistor 42 to the output terminal 41. Thus, the potential on the terminal 41 is proportional to the radiation induced current flow through the resistance 42.

A particular advantage of the detector of the present invention is that the charge collection function and the charge sensing functions are separated. The areas of the transparent conductive members 17 and 19 may be made very large in relation to the surface area of the P-type region 26, for example 100 times, to provide high sensitivity while the area of the P-type region 26 may be kept quite small to provide low output capacitance and hence high voltage output in relation to photon input. By utilizing high values of reverse bias on the P-type region, the capacitance of this region may be further reduced and hence the sensitivity of the detector further improved.

For the utilization of the device to detect radiation to which the semiconductor is transparent such as, for example, X-rays, suitable conversion means for converting X-rays to light to which the semiconductor material is responsive is provided. To this end, in FIGS. 1, 2 and 3 is shown a scintillator 45 suitable for the conversion of X-rays into visible light to which silicon is responsive. The scintillator 45 may be constituted of a material such as cesium iodide.

In the detector of the present invention, charge carriers generated and collected in the depletion region 34 and 35 move by diffusion to the output region 26 where they may be stored or read out. The time of travel from the point of generation in the depletion regions to the output region is a function of the square of the distance between the point of generation and the output region. Thus, the speed of response of the detector is a function of the size of the depletion region along the surface in relation to the output region of opposite conductivity. The speed of response is also a funtion of the location of the output region in relation to the depletion region. In the detector described in connection with FIGS. 1-3, the provision of elongated conductive members 17 and 19 and an elongated region 26 of opposite conductivity type underlying both electrodes 17 and 19 keeps the distance that carriers generated in the depletion regions must travel to reach the output region 26 to a minimum, and thus provides a high speed of response. This high speed of response is at the expense of some decrease in sensitivity due to increased area of the output P-N junction. A number of electrically connected elongated regions of opposite conductivity type may be provided on a common substrate, each with its pair of associated elongated conductive members to enhance the speed of response. The number and spacing of such elongated regions is chosen so as to obtain the desired speed of response.

A particular advantageous organization of materials for the detector of the present invention comprises a substrate of silicon, an insulating layer of silicon dioxide overlying the substrate and a thin layer of a metal, for example, a layer of molybdenum about 10 Angstroms thick. The thin layer of metal passes radiation over a broad band from deep in the ultraviolet portion of spectrum to well into the infra-red portion of the spectrum. The silicon dioxide has a band gap of about 10.5 electron volts and hence would also transmit radiation from deep in the ultraviolet portion of the spectrum well into the infrared portion of the spectrum. Thus, the detector response would be determined primarily by the response of the silicon substrate. As pointed out below this response in terms of quantum efficiency as a function of wavelength would be excellent from deep in the ultraviolet portion of the spectrum into the short wavelength part of the infrared portion of the spectrum.

While the invention has been described in connection with devices made of silicon semiconductor material, it is understood that the invention is equally applicable to devices made of other semiconductor materials, such as germanium, gallium phosphide and gallium arsenide.

While the invention has been described in connection with devices constituted of a semiconductor substrate of N-type conductivity with a P-type output region, it will be understood that P-type substrates with an N-type output region could as well be used. In such a case the applied potentials would be reversed in polarity.

The detector of the present invention is particularly advantageous over P-N junction detectors. In the detector of the present invention the depletion region in which charge generation and collection occurs can be made very large in relation to the size of the region of opposite conductivity type with greatly increased sensitivity of the detector, as pointed out above. Also, in the detector of the present invention the depletion region, in which charge generation and collection occurs, extends to the surface of the semiconductor substrate. Thus, charge carriers which are generated near the surface of the substrate by radiation in the blue and ultraviolet portions of the spectrum are substantially all collected with resultant high efficiency of conversion of radiation into electrical signal. In P-N junction detectors, the P-N junction is located below the surface of the semiconductor substrate. Carriers generated at the surface of the substrate in response to radiation must travel through heavily doped surface adjacent regions of the substrate to the P-N junction to be detected. A large proportion of the carriers generated at the surface recombine both at the surface and in the bulk of the substrate before they reach the P-N junction with resultant lower efficiency of conversion of radiation into electrical signal.

While the invention has been described in specific embodiments, it would be understood that modifications may be made by those skilled in the art and it is intended by the appended claims to cover all such modifications and changes as fall within the true spirit and scope of the invention.

What we claim as new and desire to secure by Letters Patent of the United States is:

1. A radiation sensing device comprising
   a substrate of monocrystalline semiconductor material of one conductivity type,
   a first layer of a transparent insulating material overlying a major surface of said substrate,
   a second layer of a transparent conductive material overlying said first layer and forming a first capacitor with said substrate and said first layer,
   a region of opposite conductivity type in said substrate adjacent said major surface forming a PN junction therewith, said PN junction having a first edge in said major surface and underlying said second layer of transparent conductive material, the area of said region of opposite conductivity type in said major surface being substantially smaller than the area of said second layer of transparent conductive material.

2. The device of claim 1 in which both said second layer and said region of opposite conductivity type are of elongated configurations and in which said first edge of said PN junction is substantially linear and substantially parallel to the longitudinal axis of said second layer.

3. The device of claim 2 in which a third layer of a transparent conductive material and of elongated configuration overlies said first layer and forms a second capacitor with said substrate and said first layer, in which said PN junction has a second substantially linear edge, said second linear edge underlying said third layer of transparent conductive material and being substantially parallel to the longitudinal axis of said third layer.

4. The device of claim 1 in which is provided means for biasing said second layer with respect to said substrate to establish a minority carrier charge collection region therein and in which is provided means for reversely biasing said region of opposite conductivity type with respect to said substrate, the absolute value of the potential of said region of opposite conductivity type being greater than the absolute value of the surface potential of said major surface underlying said second layer.

5. The device of claim 1 in which said semiconductor material is silicon.

6. The device of claim 1 in which said transparent conductive material is selected from the class consisting of tin oxide, indium tin oxide, and antimony tin oxide.

7. The device of claim 1 in which said second layer is a thin transparent layer of a metal.

* * * * *